United States Patent
Park et al.

(10) Patent No.: US 12,469,721 B2
(45) Date of Patent: Nov. 11, 2025

(54) APPARATUS FOR MANUFACTURING A SEMICONDUCTOR DEVICE AND METHOD OF MANUFACTURING THE APPARATUS

(71) Applicant: SAMSUNG ELECTRONICS CO., LTD., Suwon-si (KR)

(72) Inventors: Hwanyeol Park, Seoul (KR); Kyung Nam Kang, Hwaseong-si (KR); Jeong Hoon Nam, Suwon-si (KR); Se Jin Kyung, Seoul (KR); Dae Wee Kong, Yongin-si (KR); Tae-Min Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 599 days.

(21) Appl. No.: 17/736,229

(22) Filed: May 4, 2022

(65) Prior Publication Data
US 2023/0020305 A1 Jan. 19, 2023

(30) Foreign Application Priority Data
Jul. 19, 2021 (KR) .................. 10-2021-0094041

(51) Int. Cl.
| | |
|---|---|
| *H01L 21/687* | (2006.01) |
| *C22C 21/00* | (2006.01) |
| *C23C 16/30* | (2006.01) |
| *C23C 16/458* | (2006.01) |
| *H01L 21/67* | (2006.01) |

(52) U.S. Cl.
CPC ........ *H01L 21/67098* (2013.01); *C22C 21/00* (2013.01); *C22C 21/003* (2013.01); *C23C 16/303* (2013.01); *C23C 16/4581* (2013.01); *C23C 16/4586* (2013.01)

(58) Field of Classification Search
CPC ............ C23C 16/4581; C23C 16/4404; H01L 21/68757
See application file for complete search history.

(56) References Cited

U.S. PATENT DOCUMENTS

| | | | |
|---|---|---|---|
| 7,419,702 B2 | 9/2008 | Nakamura et al. | |
| 9,975,320 B2 | 5/2018 | Duan et al. | |
| 10,020,218 B2 | 7/2018 | Boyd, Jr. et al. | |
| 10,266,943 B2 | 4/2019 | Khaja et al. | |
| 2007/0054045 A1* | 3/2007 | Hou ............ | C23C 16/4404 118/724 |
| 2009/0314310 A1* | 12/2009 | Shishido ........ | C23C 16/4405 134/1.1 |

(Continued)

FOREIGN PATENT DOCUMENTS

| | | |
|---|---|---|
| KR | 10-2005-0054952 A | 6/2005 |
| KR | 10-2012-0103596 A | 9/2012 |

(Continued)

*Primary Examiner* — Aiden Lee
(74) *Attorney, Agent, or Firm* — Muir Patent Law, PLLC

(57) ABSTRACT

An apparatus for manufacturing a semiconductor device and a method of manufacturing the apparatus, the apparatus including a heater configured to heat a target, and a coating layer, the coating layer including a ternary material of transition metal (M)-aluminum (Al)-nitrogen (N) represented by the following Chemical Formula:

$$M_x Al_{1-x} N_y,$$ [Chemical Formula]

wherein x and y satisfy the following relations: $0 < x < 1$ and $y \geq 1$.

14 Claims, 10 Drawing Sheets

(56) References Cited

U.S. PATENT DOCUMENTS

| | | | |
|---|---|---|---|
| 2019/0111495 A1* | 4/2019 | Maekawa | C23C 14/0641 |
| 2020/0013589 A1* | 1/2020 | Balaraman | C23C 16/34 |
| 2020/0185247 A1* | 6/2020 | Chia | H01L 21/6833 |
| 2021/0010126 A1 | 1/2021 | Firouzdor et al. | |
| 2022/0018012 A1* | 1/2022 | Shang | B32B 15/04 |

FOREIGN PATENT DOCUMENTS

| | | |
|---|---|---|
| KR | 10-2015-0084779 A | 7/2015 |
| KR | 10-1550439 B1 | 9/2015 |

* cited by examiner

APPARATUS FOR MANUFACTURING A SEMICONDUCTOR DEVICE AND METHOD OF MANUFACTURING THE APPARATUS

CROSS-REFERENCE TO RELATED APPLICATION

This application claims priority from Korean Patent Application No. 10-2021-0094041 filed on Jul. 19, 2021 in the Korean Intellectual Property Office, and all the benefits accruing therefrom under 35 U.S.C. § 119, the contents of which in its entirety are herein incorporated by reference.

BACKGROUND

1. Field

Embodiments relate to an apparatus for manufacturing a semiconductor device and a method for manufacturing the apparatus.

2. Description of the Related Art

Recent trends in the semiconductor manufacturing industry show that a minimum line width applied to a semiconductor integrated circuit process has been steadily reduced to increase the operation speed of a semiconductor chip and increase the information storage capacity per unit area. In addition, a size of a semiconductor device, such as a transistor integrated on a semiconductor substrate, has been gradually miniaturized.

The semiconductor device may be manufactured through a deposition process, a photo process, an etching process, a diffusion process, and the like. For example, the deposition process is a process in which improvement in reproducibility and reliability of manufacture of a semiconductor device may be desirable. For example, a deposition layer may be formed on a substrate by a sol-gel method, a sputtering method, an electro-plating method, an evaporation method, a chemical vapor deposition method, a physical vapor deposition method, a molecule beam epitaxy method, an atomic layer deposition method, or the like. The chemical vapor deposition method and the atomic layer deposition method may be most commonly used because of deposition characteristics and uniformity of the deposition layer on the substrate, which are more excellent than the other deposition methods.

SUMMARY

The embodiments may be realized by providing an apparatus for manufacturing a semiconductor device, the apparatus including a heater configured to heat a target; and a coating layer on the heater, the coating layer including a ternary material of transition metal (M)-aluminum (Al)-nitrogen (N) represented by the following Chemical Formula:

$M_xAl_{1-x}N_y$, [Chemical Formula]

wherein x and y satisfy the following relations: $0<x<1$ and $y\geq 1$.

The embodiments may be realized by providing a method of manufacturing an apparatus for manufacturing a semiconductor device such that the apparatus includes a heater configured to heat a target and a coating layer on the heater, the method including forming the coating layer on the heater, wherein forming the coating layer includes forming a base layer including a ternary material of transition metal (M)-aluminum (Al)-nitrogen (N) represented by the following Chemical Formula:

$M_xAl_{1-x}N_y$, [Chemical Formula]

x and y satisfy the following relations: $0<x<1$ and $y\geq 1$.

The embodiments may be realized by providing an apparatus for manufacturing a semiconductor device, the apparatus including a process chamber; and a loader in the process chamber, a target being supportable on the loader, wherein the loader includes a heater configured to heat the target, and a coating layer on the heater, the coating layer including a first layer, a second layer, and a passivation layer that are sequentially stacked, each of the first layer, the second layer, and the passivation layer independently includes a ternary material of transition metal (M)-aluminum (Al)-nitrogen (N) represented by the following Chemical Formula:

$M_xAl_{1-x}N_y$, [Chemical Formula]

x and y satisfy the following relations: $0<x<1$ and $y\geq 1$, an aluminum content of the first layer is higher than an aluminum content of the second layer, and a nitrogen content of the passivation layer is higher than a nitrogen content of the second layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
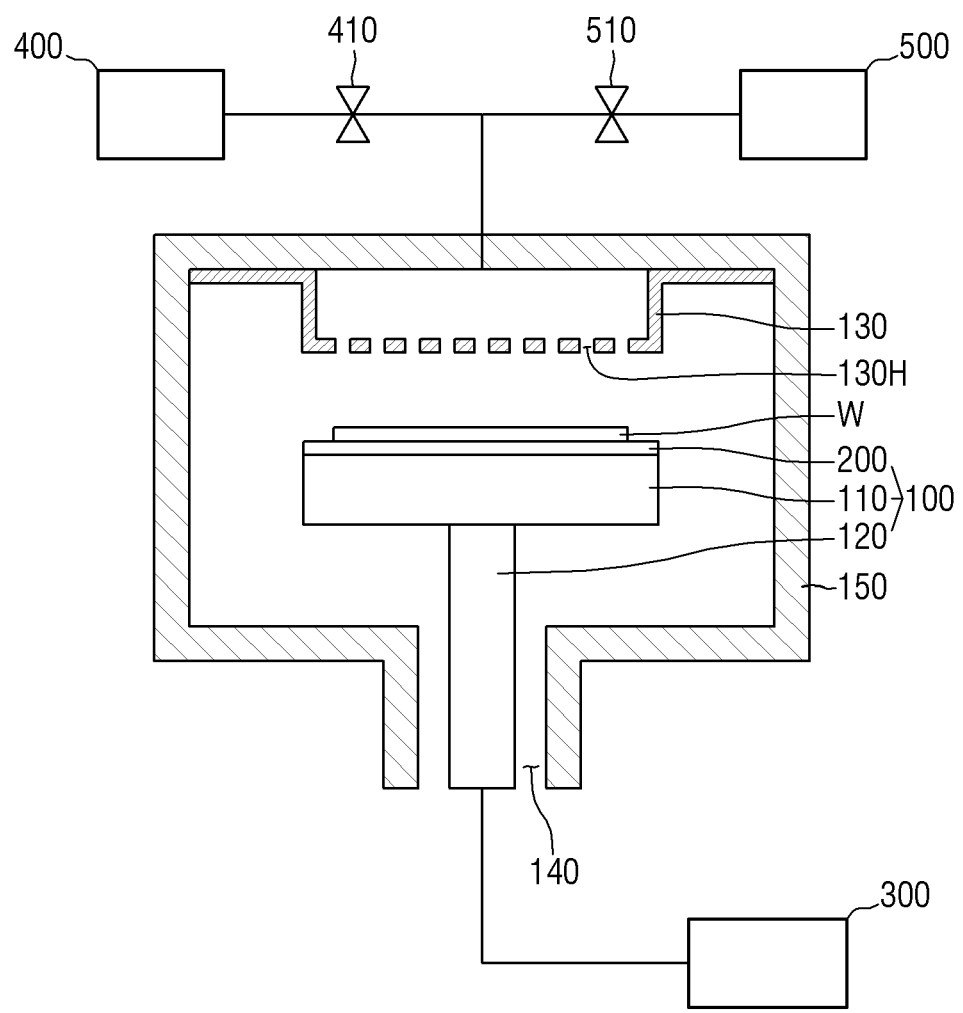
FIG. 1 is a view of an apparatus for manufacturing a semiconductor device including a loader according to some embodiments of the present disclosure.
Figure 2:
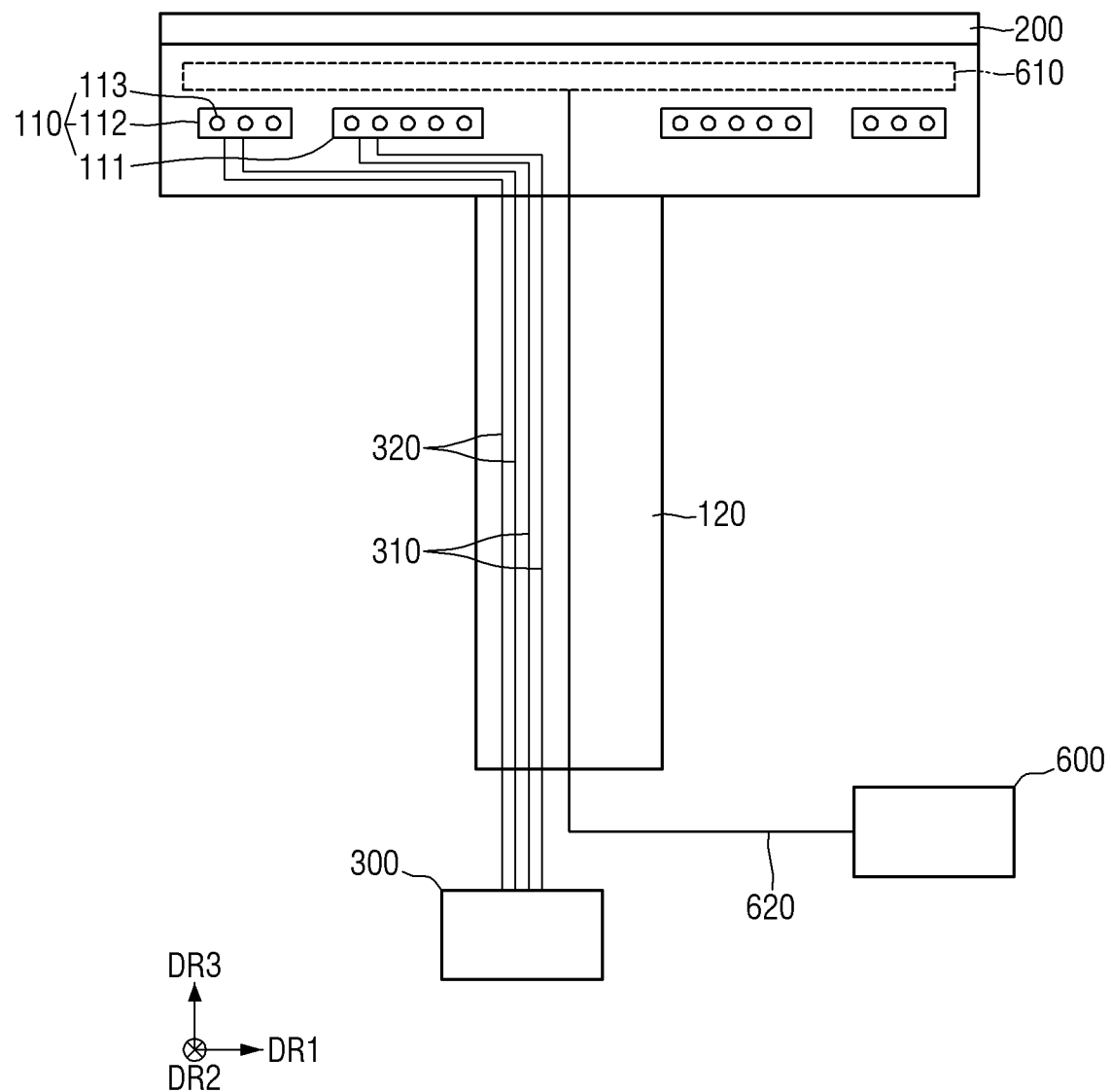
FIG. 2 is a view of the loader of FIG. 1.
Figure 3:
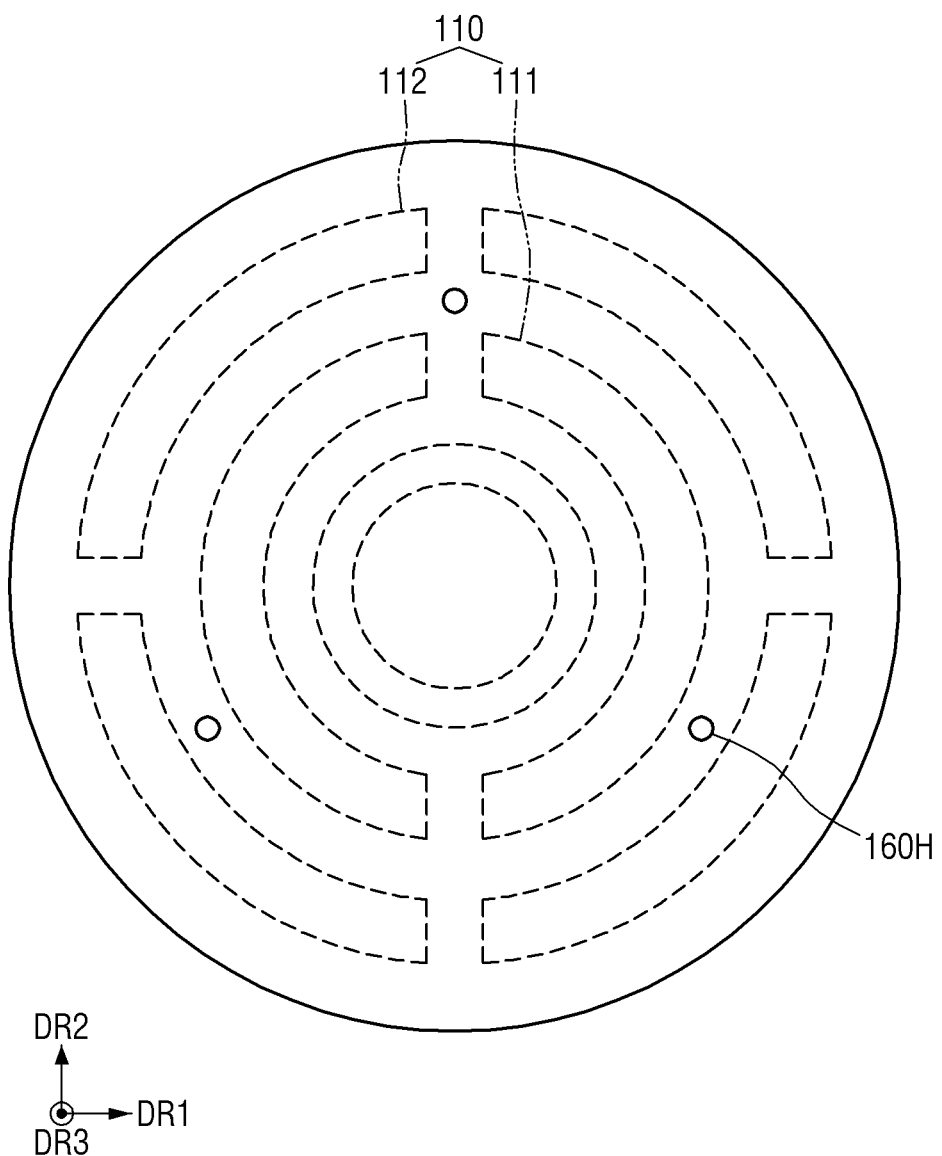
FIG. 3 is a view of each area of a heater of FIG. 2.

FIG. 1 is a view of an apparatus for manufacturing a semiconductor device including a loader according to some embodiments of the present disclosure. FIG. 2 is a view of the loader of FIG. 1. FIG. 3 is a view illustrating each area of a heater of FIG. 2.

Referring to FIGS. 1 and 2, the apparatus for manufacturing a semiconductor device according to some embodiments of the present disclosure may include a process chamber 150, a loading unit or loader 100, and first and second power supply lines 310 and 320. The loader 100 may include a heater unit or heater 110 and a coating layer 200.

The process chamber 150 may serve as a housing that includes other components therein. The process chamber 150 may be an isolated space in which a treatment process of a target is performed to manufacture a semiconductor device. In an implementation, the target may be, e.g., a substrate W. In an implementation, the process chamber 150 may be a treatment space in which a deposition process of semiconductor manufacturing processes is performed.

In an implementation, a substrate inlet may be on or in one sidewall of the process chamber 150. The substrate inlet may be a passage through which the substrate W may enter (and exit) the process chamber 150. The substrate inlet may be opened and closed by a switching member, e.g., a door.

A showerhead 130 may supply a reaction gas for the deposition process in the process chamber 150. A plurality of spray holes 130H may be in the showerhead 130 to uniformly spray the gas.

An exhaust 140 may be on a bottom surface of the process chamber 150. In an implementation, the exhaust 140 may be connected with an exhaust line. The inside of the process chamber 150 may be maintained at a pressure lower than an atmospheric pressure by exhausting through the exhaust line. In an implementation, reaction by-products generated during the process and the gas remaining in the process chamber 150 may be discharged to the outside through the exhaust line.

The showerhead 130 may include, e.g., stainless steel, aluminum (Al), anodized aluminum, nickel (Ni), or other conductive material. The showerhead 130 may have a thickness that maintains sufficient flatness and uniformity so as not to adversely affect the deposition process. As used herein, the term "or" is not an exclusive term, e.g., "A or B" would include A, B, or A and B.

In an implementation, a high-frequency electrode may be on the showerhead 130 to apply RF power for exciting the reaction gas to a plasma state. The high-frequency electrode may be connected with a power supply 300 for generating RF power.

A valve 410 may be connected with a reaction gas supply 400, and the reaction gas used for the deposition process may be supplied to the inside of the process chamber 150 through a reaction gas supply line. In an implementation, a valve 510 may be connected with a cleaning gas supply 500, and a cleaning gas used to clean the inside of the process chamber 150 may be supplied through a cleaning gas supply line.

The reaction gas may include a gas for depositing silicon dioxide ($SiO_2$), which is mainly used as an insulating layer, on the substrate W. The cleaning gas may include a nitrogen trifluoride ($NF_3$) gas for removing a silicon dioxide ($SiO_2$) thin film. In an implementation, cleaning inside the process chamber 150 may be performed through, e.g., dry cleaning using the nitrogen trifluoride ($NF_3$) gas.

The loader 100 may be in the process chamber 150 to support the substrate W (e.g., the substrate W may be supportable on the loader 100). The loader 100 may support (e.g., hold) the substrate W by using an electrostatic force. The loader 100 may include the heater 110 and a support unit or support 120, which will be described below.

The support 120 may be below the heater 110, and may be configured to move the heater 110 up and down.

The heater 110 and the support 120 of the loader 100 may each include aluminum nitride (AlN). In an implementation, the heater 110 and the support 120 may be made of, e.g., an aluminum nitride (AlN) sintered body. In an implementation, the aluminum nitride (AlN) sintered body may include, e.g., yttrium (Y), titanium (Ti), and aluminum nitride (AlN).

The substrate W may be loaded on an upper portion of the loader 100. In an implementation, the substrate W may be circular in shape, and may include silicon (Si).

Referring to FIGS. 1 and 2, a first direction DR1 may refer to one direction in which an upper surface of the loader 100 is extended, and a second direction DR2 may refer to another direction perpendicular to the first direction DR1 and in which the upper surface of the loader 100 is extended. A third direction DR3 may refer to a direction perpendicular to each of the first direction DR1 and the second direction DR2 and in which the support 120 of the loader 100 to be described later is extended.

The substrate W may have an innermost inner side and an outer side surrounding the inner side, based on a center of a circle. Meanwhile, points indicated by the inner and outer sides of the substrate W may be different from those of FIGS. 1 and 2 within an error range of the process. Also, the points indicated by the inner and outer sides of the substrate W may be understood as mutual relative positions within the substrate W, and are not limited to absolute positions.

The heater 110 may be inside the process chamber 150. The heater 110 may accommodate the semiconductor substrate W seated thereon.

First and second heaters 111 and 112 may correspond to the inner side and the outer side of the substrate W, respectively. The first and second heaters 111 and 112 may heat the inner side and the outer side of the substrate W, respectively. Referring to FIG. 3, each of the first and second heaters 111 and 112 may have a roughly circular shape.

The first and second heaters 111 and 112 may include a hot wire 113 for maintaining the inside of the process chamber 150 at a relatively high temperature.

The hot wire 113 may include a metal. In an implementation, the hot wire 113 may include a metal, e.g., molybdenum (Mo), copper (Cu), tungsten (W), titanium (Ti), rhodium (Rh), niobium (Nb), iridium (Ir), rhenium (Re), tantalum (Ta), or a combination thereof.

The first and second heaters 111 and 112 may include pin holes 160H. When viewed from above, the pin holes 160H may surround a center of the upper surface of the heater 110. The respective pin holes 160H may be spaced apart from each other along a circumferential direction. In an implementation, each pin hole 160H may be provided with a lift pin. The lift pin may be moved to an ascending position or a descending position. The first and second heaters 111 and 112 may ascend and descend through the lift pin in the pin hole 160H.

The first power supply line 310 may supply power distributed from the power supply 300 to the first heater 111, and the second power supply line 320 may supply power distributed from the power supply 300 to the second heater 112. In an implementation, each of the first and second power supply lines 310 and 320 may include input and output terminals.

A ground terminal 600 may supply a voltage through a ground line 620 to generate a plasma layer 610. In an implementation, a high frequency bias power may be supplied to generate a plasma. The plasma layer 610 may be generated inside the loader 100 to form a potential layer.

The coating layer 200 may be on the heater 110. The coating layer 200 may include, e.g., a ternary material of transition metal (M)-aluminum (Al)-nitrogen (N). The coating layer 200 may include, e.g., a base layer 210 (see FIG. 8) on the heater 110 and a passivation layer 220 on the base layer 210.

In an implementation, each of the base layer 210 and the passivation layer 220 may include, e.g., a ternary material of transition metal (M)-aluminum (Al)-nitrogen (N) according to or represented by the following Chemical Formula.

$$M_xAl_{1-x}N_y,\qquad\text{[Chemical Formula]}$$

In the Chemical Formula, x and y may satisfy the following relations: $0<x<1$ and $y\geq 1$.

In an implementation, the transition metal M may include, e.g., titanium (Ti), zirconium (Zr), niobium (Nb), molybdenum (Mo), hafnium (Hf), tantalum (Ta), or tungsten (W).

In an implementation, the transition metal M may include or have a crystalline structure of a cubic phase. As a content of the transition metal M is increased, the coating layer 200 may include a crystalline structure of a dense cubic phase. In an implementation, permeation of impurities into the heater 110 may be reduced. As a result, thermal stress that acts on the heater 110 may be reduced, and a problem in which cracks occur in the heater 110 may also be reduced.

The base layer 210 may include at least one layer having a predetermined aluminum content. In an implementation, the base layer 210 may include a first layer 211 having a first aluminum content and a second layer 212 having a second aluminum content different from the first aluminum content. In an implementation, the first layer 211 may include a material represented by Chemical Formula above, and having an aluminum content corresponding with $0<x\leq 0.2$. In an implementation, the second layer 212 may include a material represented by Chemical Formula above, and having an aluminum content corresponding with $1>x\geq 0.7$. In an implementation, the aluminum content (e.g., in terms of x of the Chemical Formula) of the first layer 211 may be, e.g., 0.8 (e.g., 80 at %, based on a total number of atoms of the transition metal M and Al) or more and 0.9 or less, and the aluminum content of the second layer 212 may be, e.g., 0.2 or more and 0.3 or less.

In an implementation, the first layer 211 (having the highest or relatively higher aluminum content in the base layer 210) may be adjacent (e.g., proximate or closest) to the heater 110. In an implementation, adhesion with the heater 110 may be enhanced, as compared with a case in which a portion of the base layer 210 having an aluminum content smaller than that of the first layer 211 were to be adjacent to the heater 110.

In an implementation, the second layer 212 (having the lowest or relatively lower aluminum content in the base layer 210) may be farthest away from (e.g., distal to) the surface of the heater 110. As a result, impurities may be prevented from being permeated into the heater 110 from the outermost area of the base layer 210.

The first layer 211 and the second layer 212 (on the first layer 211) may form a single unit structure US. In an implementation, the aluminum content of the unit structure US may be highest in an area or region adjacent to the heater 110. In an implementation, a plurality of unit structures US may be on the heater 110.

In an implementation, the base layer 210 may further include a third layer 213 having a third aluminum content, which may be higher than the second aluminum content and lower than the first aluminum content, between or within the unit structures US (e.g., between the first layer 211 and the second layer 212). In an implementation, the aluminum content of each of the first to third layers 211, 212 and 213 may be reduced as each layer becomes far away from the heater 110 (e.g., along the third direction DR3). In an implementation, the third layer 213 may include a material represented by Chemical Formula above, and having an aluminum content corresponding with $0.2<x<0.7$. In an implementation, the aluminum content of the third layer 213 may be, e.g., 0.5 or more and 0.6 or less.

In an implementation, the third layer 213 may be between the first layer 211 and the second layer 212, and adhesion between the first layer 211 and the second layer 212 may be enhanced. In an implementation, by including the first to third layers 211, 212 and 213, it is possible to effectively prevent impurities from being permeated into the heater 110 and reduce thermal stress that acts on the heater 110.

A nitrogen content of the passivation layer 220 may be higher than that of the base layer 210. In an implementation, the passivation layer 220 may include a material doped with nitrogen, and represented by the above Chemical Formula such that y satisfies the following relation: $1<y\leq 5$.

In an implementation, by including the material in the passivation layer 220 doped with nitrogen, damage to the heater 110, which could otherwise be caused by the plasma, may be reduced. In an implementation, it is possible to help prevent impurities from being permeated into the heater 110 from the outermost area of the coating layer 200 and to help prevent the surface of the heater 110 from being oxidized.

A phase (e.g., crystal phase) of the base layer 210, which is in contact with the passivation layer 220, and a phase (e.g., crystal phase) of the passivation layer 220 may be the same as each other. In an implementation, an aluminum content of the base layer 210, which is in contact with the passivation layer 220, and an aluminum content of the passivation layer 220 may be the same as each other.

Thicknesses of the first to third layers 211, 212 and 213 and the passivation layer 220 may be, e.g., 1 μm or more and 5 μm or less. In an implementation, the thickness of each of the first to third layers 211, 212 and 213 and the passivation layer 220 may be, e.g., 1 μm or more and 5 μm or less. In an implementation, a sum of the thicknesses of the first to third layers 211, 212 and 213 and the passivation layer 220 may be, e.g., 1 μm or more and 5 μm or less.

Figure 4:
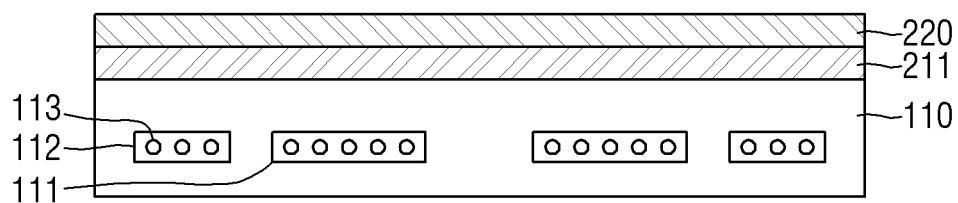
FIG. 4 is a view of an apparatus for manufacturing a semiconductor device including a loader according to some embodiments of the present disclosure.

FIG. 4 is a view of an apparatus for manufacturing a semiconductor device including a loader according to some embodiments of the present disclosure. For convenience of description, portions duplicated with those described with reference to FIGS. 1 to 3 may be described briefly or omitted.

Referring to FIG. 4, the coating layer 200 may include a first layer 211 and a passivation layer 220 on the first layer 211. As described above, the first layer 211 may include a material represented by the Chemical Formula in which an aluminum content corresponds with x satisfying the following relation: $0<x\leq 0.2$. In an implementation, the aluminum content of the first layer 211 may be 0.8 or more and 0.9 or less.

In an implementation, first, the first layer 211 may include a ternary material of transition metal (M)-aluminum (Al)-nitrogen (N), e.g., and may include a material represented by the Chemical Formula in which an aluminum content corresponds with x satisfying the following relation: $0<x\leq 0.2$, and may be formed on the heater 110.

Afterwards, the passivation layer 220 (having a nitrogen content higher than that of the first layer 211) may be formed on the first layer 211.

In an implementation, a phase of the first layer 211 (e.g., in contact with the passivation layer 220) and a phase of the passivation layer 220 may be the same as each other. In an implementation, the phase of the first layer 211 and the phase of the passivation layer 220 may be, e.g., wurtzite phases. In an implementation, the aluminum content of the portion of the first layer 211 (in contact with the passivation layer 220) and the aluminum content of the passivation layer 220 may be the same as each other.

In an implementation, the first layer 211 and the passivation layer 220 may be formed using, e.g., a chemical vapor deposition (CVD) method, a physical vapor deposition (PVD) method, a spin coating method, or a sputtering method.

Figure 5:
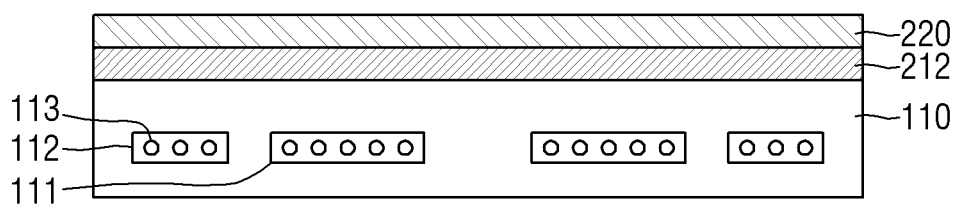
FIG. 5 is a view of an apparatus for manufacturing a semiconductor device including a loader according to some embodiments of the present disclosure.

FIG. 5 is a view of an apparatus for manufacturing a semiconductor device including a loader according to some embodiments of the present disclosure. For convenience of description, portions duplicated with those described with reference to FIGS. 1 to 4 will be described briefly or omitted.

Referring to FIG. 5, the coating layer 200 may include a second layer 212 and a passivation layer 220 on the second layer 212. As described above, the second layer 212 may include a material represented by the Chemical Formula in which an aluminum content corresponds with x satisfying the following relation: $1 > x \geq 0.7$. In an implementation, the aluminum content of the second layer 212 may be 0.2 or more and 0.3 or less.

In an implementation, first, the second layer 212 including a ternary material of transition metal (M)-aluminum (Al)-nitrogen (N) and including a material represented by the Chemical Formula in which an aluminum content corresponds with x satisfying the following relation. $1 > x \geq 0.7$, may be formed on the heater 110.

Afterwards, the passivation layer 220 (including a ternary material of transition metal (M)-aluminum (Al)-nitrogen (N) and having a nitrogen content higher than that of the second layer 212) may be formed on the second layer 212.

In an implementation, a phase of the second layer 212 (e.g., in contact with the passivation layer 220) and a phase of the passivation layer 220, may be the same as each other. In an implementation, the phase of the second layer 212 and the phase of the passivation layer 220 may be cubic phases. In an implementation, the aluminum content of the portion of the second layer 212 in contact with the passivation layer 220 and the aluminum content of the passivation layer 220 may be the same as each other.

In an implementation, the second layer 212 and the passivation layer 220 may be formed using, e.g., a chemical vapor deposition (CVD) method, a physical vapor deposition (PVD) method, a spin coating method, or a sputtering method.

Figure 6:
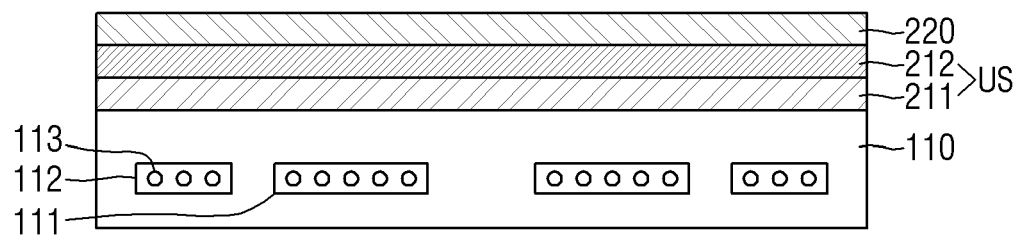
FIG. 6 is a view of an apparatus for manufacturing a semiconductor device including a loader according to some embodiments of the present disclosure.

FIG. 6 is a view of an apparatus for manufacturing a semiconductor device including a loader according to some embodiments of the present disclosure. For convenience of description, portions duplicated with those described with reference to FIGS. 1 to 5 will be described briefly or omitted.

Referring to FIG. 6, the coating layer 200 may include a base layer including a unit structure US in which a first layer 211 and a second layer 212 are deposited, and a passivation layer 220 on the base layer.

Figure 9:
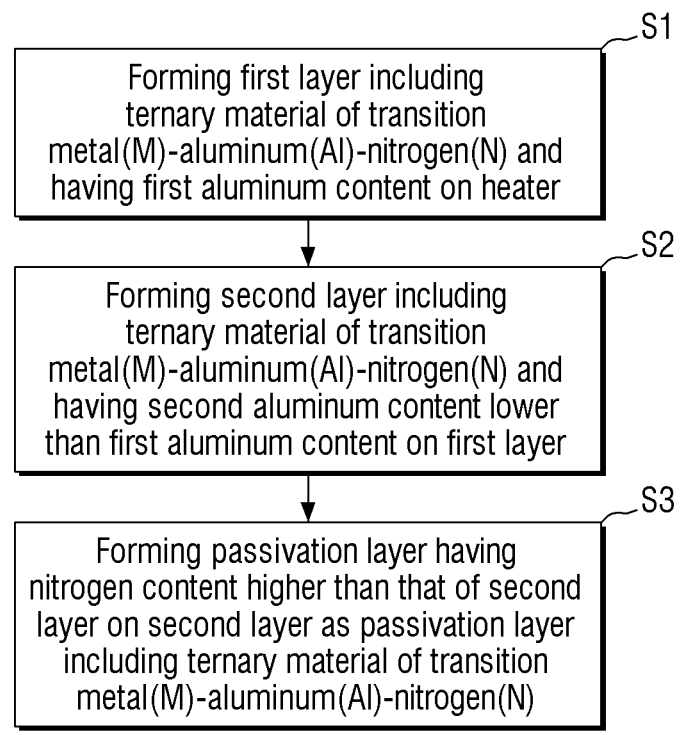
FIG. 9 is a flowchart of a method for manufacturing a semiconductor device using an apparatus for manufacturing the semiconductor device according to some embodiments of the present disclosure.

FIG. 9 is a flowchart of a method for manufacturing a semiconductor device using an apparatus for manufacturing the semiconductor device according to some embodiments of the present disclosure. FIG. 9 is a flowchart of a method for manufacturing a semiconductor device using the apparatus for manufacturing a semiconductor device in accordance with FIG. 6.

First, a first layer 211 including a ternary material of transition metal (M)-aluminum (Al)-nitrogen (N) represented by the Chemical Formula in which an aluminum content corresponds with x satisfying the following relation: $0 < x \leq 0.2$, may be formed on a heater 110 (S1).

Then, a second layer 212 including a ternary material of transition metal (M)-aluminum (Al)-nitrogen (N) represented by the Chemical Formula in which an aluminum content corresponds with x satisfying the following relation: $1 > x \geq 0.7$, may be formed on the first layer 211 (S2).

In an implementation, the unit structure US of the first layer 211 (having a first aluminum content) and the second layer 212 (having a second aluminum content different from the first aluminum content) on the first layer 211, may be formed to form a base layer 210.

In an implementation, an aluminum content of the unit structure US may be highest in the first layer 211, e.g., an area adjacent to the heater 110.

Then, a passivation layer 220 including a ternary material of transition metal (M)-aluminum (Al)-nitrogen (N) and having a nitrogen content higher than that of the second layer 212 may be formed on the second layer 212 (S3).

In an implementation, a phase of the second layer 212, which is in contact with the passivation layer 220, and a phase of the passivation layer 220 may be the same as each other. In an implementation, both the phase of the second layer 212 and the phase of the passivation layer 220 may be cubic phases. In an implementation, the aluminum content of the second layer 212, which is in contact with the passivation layer 220, and the aluminum content of the passivation layer 220 may be the same as each other.

In an implementation, the phase of the first layer 211 (below the second layer 212) and the phase of the second layer 212 may be different from each other. In an implementation, the phase of the second layer 212 may be a cubic phase, and the phase of the first layer 211 may be a wurtzite phase. In an implementation, the aluminum content of the first layer 211 may be higher than that of the second layer 212.

In an implementation, the first and second layers 211 and 212 having their respective aluminum contents different from each other may alternately be disposed, and thermal stress acting on the heater 110 may be reduced more effectively.

In an implementation, the first layer 211, the second layer 212, and the passivation layer 220 may each be formed using, e.g., a chemical vapor deposition (CVD) method, a physical vapor deposition (PVD) method, a spin coating method, or a sputtering method.

Figure 7:
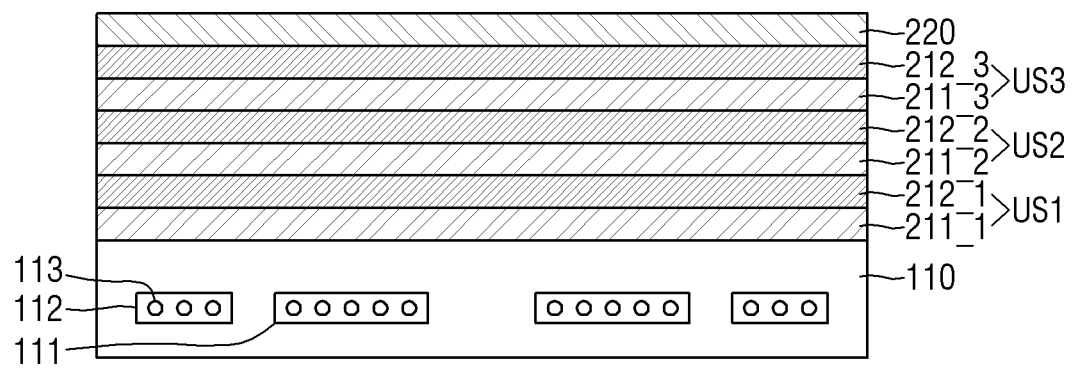
FIG. 7 is a view of an apparatus for manufacturing a semiconductor device including a loader according to some embodiments of the present disclosure.

FIG. 7 is a view of an apparatus for manufacturing a semiconductor device including a loader according to some embodiments of the present disclosure. For convenience of description, portions duplicated with those described with reference to FIGS. 1 to 6 will be described briefly or omitted.

Referring to FIG. 7, a plurality of unit structures US may be on the heater 110. Each unit structure US may include the first layer 211 and the second layer 212, and may be deposited repeatedly.

In an implementation, a first unit structure US1, a second unit structure US2, and a third unit structure US3 may sequentially be deposited on the heater 110. A first layer 211_1 of the first unit structure US1 may be on or at a lowest portion of the base layer 210, which is adjacent to the heater 110, and a second layer 212_3 of the third unit structure US3 may be on or at an uppermost portion of the base layer 210.

In an implementation, an aluminum content of the first to third unit structures US1, US2 and US3 may be the highest in the first layer 211_1 of the first unit structure US1, which is adjacent to the heater 110.

Afterwards, a passivation layer 220 (having a nitrogen content higher than that of the second layer 2123) may be formed on the second layer 212_3 of the third unit structure US3, e.g., as a passivation layer 220 including a ternary material of transition metal (M)-aluminum (Al)-nitrogen (N).

In an implementation, a phase of the second layer 212_3 of the third unit structure US3, which is in contact with the passivation layer 220, and a phase of the passivation layer 220 may be the same as each other. In an implementation, both the phase of the second layer 212_3 of the third unit structure US3 and the phase of the passivation layer 220 may be cubic phases. In an implementation, an aluminum content of the second layer 212_3 of the third unit structure US3, which is in contact with the passivation layer 220, and an aluminum content of the passivation layer 220 may be the same as each other.

In an implementation, a phase of the first layer 211_1 of the first unit structure US1_1 and a phase of the second layer 212_1 may be different from each other. In an implementation, the phase of the second layer 212_1 may be a cubic phase, and the phase of the first layer 211_1 may be a wurtzite phase. In an implementation, an aluminum content of the first layer 211_1 may be higher than that of the second layer 212_1.

In an implementation, the first and second layers 211 and 212 (having their respective phases different from each other) may be disposed alternately while forming a plurality of unit structures US.

Figure 8:
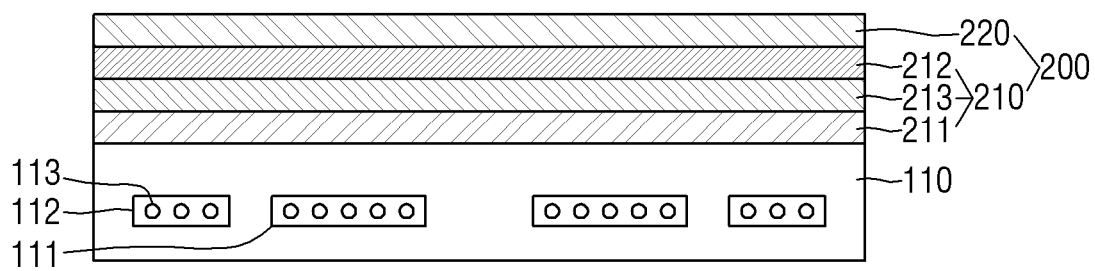
FIG. 8 is a view of an apparatus for manufacturing a semiconductor device including a loader according to some embodiments of the present disclosure.

FIG. 8 is a view of an apparatus for manufacturing a semiconductor device including a loader according to some embodiments of the present disclosure. For convenience of description, portions duplicated with those described with reference to FIGS. 1 to 7 will be described briefly or omitted.

Referring to FIG. 8, the coating layer 200 (e.g., the base layer 210) may include a third layer 213 between the first layer 211 and the second layer 212, and a passivation layer 220 on the second layer 212. In an implementation, the third layer 213 may include a material represented by the Chemical Formula in which an aluminum content corresponds with $x$ satisfying the following relation: $0.2 < x < 0.7$. In an implementation, an aluminum content of the third layer 213 may be, e.g., 0.5 or more and 0.6 or less.

Figure 10:
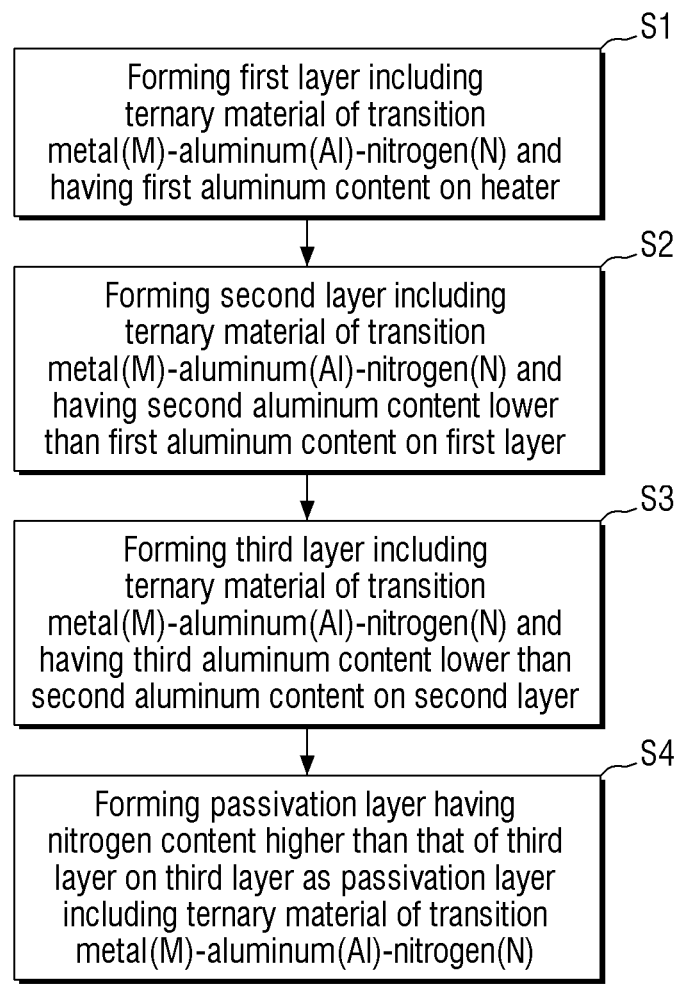
FIG. 10 is a flowchart of a method for manufacturing a semiconductor device using an apparatus for manufacturing a semiconductor device according to some embodiments of the present disclosure.

FIG. 10 is a flowchart of a method for manufacturing a semiconductor device using an apparatus for manufacturing a semiconductor device according to some embodiments of the present disclosure. FIG. 10 is a flowchart of a method for manufacturing a semiconductor device using the apparatus for manufacturing a semiconductor device in accordance with FIG. 8.

First, a first layer 211 including a ternary material of transition metal (M)-aluminum (Al)-nitrogen (N) represented by the Chemical Formula, in which an aluminum content corresponds with $x$ satisfying the following relation: $0 < x \leq 0.2$, may be formed on a heater 110 (S1).

Then, a third layer 213 including a ternary material of transition metal (M)-aluminum (Al)-nitrogen (N) represented by the Chemical Formula, in which an aluminum content corresponds with $x$ satisfying the following relation: $0.2 < x \leq 0.7$, may be formed on the first layer 211 (S2).

Then, a second layer 212 including a ternary material of transition metal (M)-aluminum (Al)-nitrogen (N) represented by the Chemical Formula, in which an aluminum content corresponds with $x$ satisfying the following relation: $1 > x \geq 0.7$, may be formed on the third layer 213 (S3).

In an implementation, an aluminum content of the first to third layers 211, 212 and 213 may be highest in the first layer 211 (e.g., adjacent to the heater 110). In an implementation, the aluminum content of the first to third layers 211, 212 and 213 may gradually be reduced as each layer becomes far away from the heater 110 (e.g., the aluminum content may gradually reduce from a position proximate to the heater 110 to a position distal to the heater 110 in the third direction DR3).

The, a passivation layer 220 including a ternary material of transition metal (M)-aluminum (Al)-nitrogen (N) and having a nitrogen content higher than that of the second layer 212 may be formed on the second layer 212 (S4).

In an implementation, a phase of the second layer 212 (which is in contact with the passivation layer 220) and a phase of the passivation layer 220 may be the same as each other. In an implementation, both the phase of the second layer 212 and the phase of the passivation layer 220 may be cubic phases. In an implementation, the aluminum content of the second layer 212 which is in contact with the passivation layer 220 and the aluminum content of the passivation layer 220 may be the same as each other.

In an implementation, a phase of the third layer 213 (below the second layer 212) and the phase of the second layer 212 may be different from each other. In an implementation, the phase of the second layer 212 is a cubic phase, and the phase of the third layer 213 may be a mixture of a wurtzite phase and a cubic phase.

In an implementation, the phase of the first layer 211 (below the third layer 213) and the phase of the third layer 213 may be different from each other. In an implementation, the phase of the third layer 213 may be a mixture of a wurtzite phase and a cubic phase, and the phase of the first layer 211 may be a wurtzite phase. In an implementation, the aluminum content of the third layer 213 may be higher than that of the second layer 212, and may be lower than that of the first layer 211.

In an implementation, the first to third layers 211, 212 and 213 having their respective aluminum contents different from each other may be disposed, and thermal stress acting on the heater 110 may be reduced more effectively.

In an implementation, the first to third layers 211, 212 and 213 and the passivation layer 220 may each be formed using, e.g., a chemical vapor deposition (CVD) method, a physical vapor deposition (PVD) method, a spin coating method, or a sputtering method.

By way of summation and review, a heater including aluminum nitride (AlN) may be used to form a thin film at a high temperature. In an in-situ cleaning process after the thin film is formed, impurities could be formed on a surface of the heater by nitrogen trifluoride ($NF_3$) gas that may be used. Such impurities could increase thermal stress that acts on the heater, and cracks could occur in the heater.

One or more embodiments may provide an apparatus for manufacturing a semiconductor device, which may help reduce thermal stress that acts on a heater.

One or more embodiments may provide a method for manufacturing apparatus for manufacturing a semiconductor device, which may help reduce thermal stress that acts on a heater of the apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for manufacturing a semiconductor device, the apparatus comprising:
a heater configured to heat a target for the semiconductor device, the heater including an aluminum nitride;
wherein the heater has a coating layer on the heater, the coating layer including:
a base layer, and
a passivation layer on the base layer, the passivation layer having a first nitrogen content higher than a second nitrogen content of the base layer, and wherein:
the base layer includes a first layer having a first aluminum content and a second layer on the first layer, the second layer having a second aluminum content different from the first aluminum content,
the first layer contacts the heater, and
the first aluminum content of the first layer is higher than the second aluminum content of the second layer; and
each layer of the coating layer independently includes a ternary material of transition metal (M)-aluminum (Al)-nitrogen (N) represented by Chemical Formula:

$M_xAl_{1-x}N_y$, [Chemical Formula]

wherein x and y satisfy: $0<x<1$ and $y\geq1$.

2. The apparatus as claimed in claim 1, wherein the base layer further includes a third layer, the third layer having a third aluminum content higher than the second aluminum content and lower than the first aluminum content.

3. The apparatus as claimed in claim 1, wherein the ternary material of transition metal (M)-aluminum (Al)-nitrogen (N) includes a transition metal (M) including Ti, Zr, Nb, Mo, Hf, Ta, or W.

4. The apparatus as claimed in claim 1, wherein the first layer includes the ternary material of transition metal (M)-aluminum (Al)-nitrogen (N) represented by the Chemical Formula in which x satisfies: $0<x\leq0.2$.

5. The apparatus as claimed in claim 1, wherein the second layer includes the ternary material of transition metal (M)-aluminum (Al)-nitrogen (N) represented by the Chemical Formula in which x satisfies: $1>x\geq0.7$.

6. The apparatus as claimed in claim 1, wherein the coating layer includes a third layer including the ternary material of transition metal (M)-aluminum (Al)-nitrogen (N) represented by the Chemical Formula in which x satisfies: $0.2<x<0.7$.

7. The apparatus as claimed in claim 1, wherein:
the heater includes an inner heater configured to heat a center of the target, and an outer heater configured to heat a periphery of the target, and
the apparatus further comprises a first power supply line configured to supply power to the inner heater, and a second power supply line configured to supply power to the outer heater.

8. An apparatus for manufacturing a semiconductor device, the apparatus comprising:
a process chamber; and
a loader in the process chamber, a target for the semiconductor device being supportable on the loader, wherein:
the loader includes a heater including aluminum nitride configured to heat the target, the heater including an aluminum nitride,
a on the heater has a coating layer on the heater, the coating layer including a first layer, a second layer, and a passivation layer that are sequentially stacked, wherein the coating layer is configured to prevent formation of cracks in the heater including aluminum nitride,
the first layer contacts the heater,
an aluminum content of the first layer is higher than an aluminum content of the second layer,
a nitrogen content of the passivation layer is higher than a nitrogen content of the second layer, and
each of the first layer, the second layer, and the passivation layer independently includes a ternary material of transition metal (M)-aluminum (Al)-nitrogen (N) represented by Chemical Formula:

$M_xAl_{1-x}N_y$, [Chemical Formula]

x and y satisfy: $0<x<1$ and $y\geq1$.

9. The apparatus as claimed in claim 8, wherein the aluminum content of the second layer is the same as an aluminum content of the passivation layer.

10. The apparatus as claimed in claim 8, wherein:
the coating layer further includes a third layer between the first layer and the second layer, and
the aluminum content of each of the first layer, the second layer, and the third layer is reduced with increasing distance from the heater.

11. A method of manufacturing an apparatus for manufacturing a semiconductor device such that the apparatus includes a heater configured to heat a target for the semiconductor device, the method comprising
forming a coating layer on the heater including an aluminum nitride,
wherein forming the coating layer includes:
forming a base layer and forming a passivation layer on the base layer, the passivation layer having a first nitrogen content higher than a second nitrogen content of the base layer,
wherein the base layer includes a first layer having a first aluminum content and a second layer on the first layer, the second layer having a second aluminum content different from the first aluminum content, and
wherein the first layer contacts the heater, and the first aluminum content of the first layer is higher than the second aluminum content of the second layer; wherein:
each layer of the coating layer independently includes a ternary material of transition metal (M)-aluminum (Al)-nitrogen (N) represented by Chemical Formula:

$M_xAl_{1-x}N_y$, and [Chemical Formula]

x and y satisfy: $0<x<1$ and $y\geq1$.

12. The method as claimed in claim 11, wherein:
the base layer is in contact with the passivation layer, and
a crystal phase of the base layer is the same as a crystal phase of the passivation layer.

13. The method as claimed in claim 11, wherein the ternary material of transition metal (M)-aluminum (Al)-nitrogen (N) includes a transition metal (M) including Ti, Zr, Nb, Mo, Hf, Ta, or W.

14. The method as claimed in claim 11, wherein forming the base layer further includes forming a third layer, the third layer having a third aluminum content higher than the second aluminum content and lower than the first aluminum content.

* * * * *